United States Patent [19]
Driscoll et al.

[11] 4,267,513
[45] May 12, 1981

[54] IMPULSE GENERATOR APPARATUS

[75] Inventors: Michael M. Driscoll, Ellicott;
Thomas K. Lisle, Jr., Baltimore, both of Md.

[73] Assignee: The United States of America as represented by the Secretary of the Air Force, Washington, D.C.

[21] Appl. No.: 73,479

[22] Filed: Sep. 7, 1979

[51] Int. Cl.³ ............................................. H03K 3/01
[52] U.S. Cl. ...................................... 328/60; 328/39; 328/167; 307/225 R
[58] Field of Search ............. 307/225 R, 268; 328/39, 328/41, 60, 167

[56] References Cited
U.S. PATENT DOCUMENTS 3,873,928  3/1975  Lafuzo .................................. 328/39
4,034,302  7/1977  May, Jr. ................................ 328/39

Primary Examiner—Stanley D. Miller, Jr.
Assistant Examiner—B. P. Davis
Attorney, Agent, or Firm—Donald J. Singer; William Stepanishen

[57] ABSTRACT

An impulse generator apparatus for a high resolution Chirp radar utilizing a fast settling time VHF oscillator in combination with a digital counter and a low phase distortion output filter to provide a sharp gated sinusoid impulse waveform to excite the receiver dispersive delay line.

7 Claims, 11 Drawing Figures

IMPULSE GENERATOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present apparatus relates broadly to a transmit pulse generator, and in particular to an impulse generator apparatus for a Chirp radar unit.

The pulse generator is an electronic circuit which is capable of producing a waveform that rises abruptly, maintains a relatively flat top for a predetermined interval, and then abruptly falls to zero. Various circuits, such as the relaxation oscillator, have been utilized to generate a rectangular waveform having an extremely short duration, and as such are referred to as pulse generators. However, there is a class of circuits whose exclusive function is generating short-duration, rectangular waveforms and these circuits are usually specifically identified as pulse generators.

In the prior art, pulse generators of the type described above have been utilized in virtually all types of electronic systems wherein the performance of various sequential, repetitive and timing operations are required. An example of pulse generator use would be in a digital computer system to perform critical timing functions within the system. In the area of radar systems, both in the operation and testing thereof, the pulse generator finds an application in providing stable well controlled pulses.

SUMMARY OF THE INVENTION

The present invention utilizes a fast settling time oscillator circuit to provide a stable clock frequency to a digital counting circuit. The clock frequency is divided in the digital counting circuit to provide an impulse signal at a predetermined time. The impulse signal is filtered in a low phase distortion filter to provide a spectral envelope flatness of approximately 1 dB over the frequency band.

It is one object of the present invention, therefore, to provide an improved impulse generator apparatus.

It is another object of the invention to provide an improved impulse generator apparatus having a controlled impulse starting phase.

It is another object of the invention to provide an improved impulse generator apparatus having a relatively large peak impulse level.

It is still another object of the invention to provide an improved impulse generator apparatus having a spectral flatness of 0.5 dB.

It is yet another object of the invention to provide an improved impulse generator apparatus wherein impulse ringing is 46 dB down at 100 nsec.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
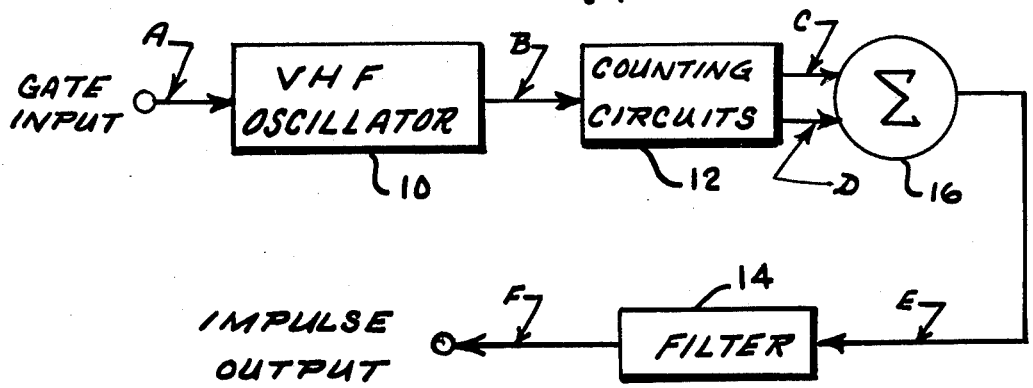
FIG. 1 is a block diagram of the improved impulse generator apparatus according to the present invention.
Figure 2:
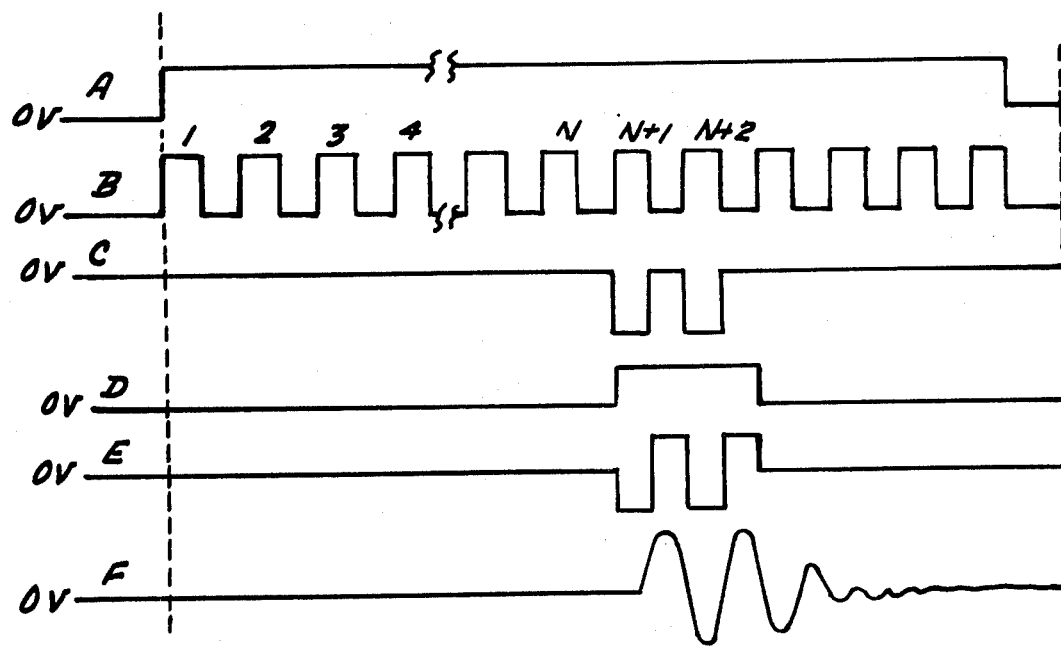
FIG. 2 is a graphical representation of the waveform which occur at indicated points in FIG. 1.

Referring now to FIG. 1, there is shown a block diagram of the impulse generator apparatus comprising a fast settling time VHF oscillator 10, a digital counting circuit 12 and a low phase distortion output filter 14. The gate input to the VHF oscillator 10 is shown in FIG. 2 as waveform A which is correspondingly indicated in FIG. 1. The output from the oscillator 10 which is shown in FIG. 2 as waveform B, is shown as a series of TTL output pulses. The TTL output waveform B is applied to the counting circuits 12 and the digital counting circuitry counts cycles of the input clock (waveform B). After a predetermined length of time (N cycles, wherein N is an integer greater than zero), the digital counting circuit 12 generates two output signals which are shown in FIG. 2 as waveforms C and D. The waveforms C and D are applied to summing unit 16 wherein the two signals are added to produce a digital waveform E which comprises two cycles of the input clock with negligible dissymmetry. The counter operation is non-synchronous in order to minimize power supply load variations which may occur at the clock rate. The output filter 14 removes impulse harmonics which are high frequency components that are due to non-synchronous counter operation. The output filter 14 also removes low frequency components that are due to non-exact dissymmetry cancellation. The output pulse from the output filter 14 is shown in FIG. 2 as waveform F.

Figure 3:
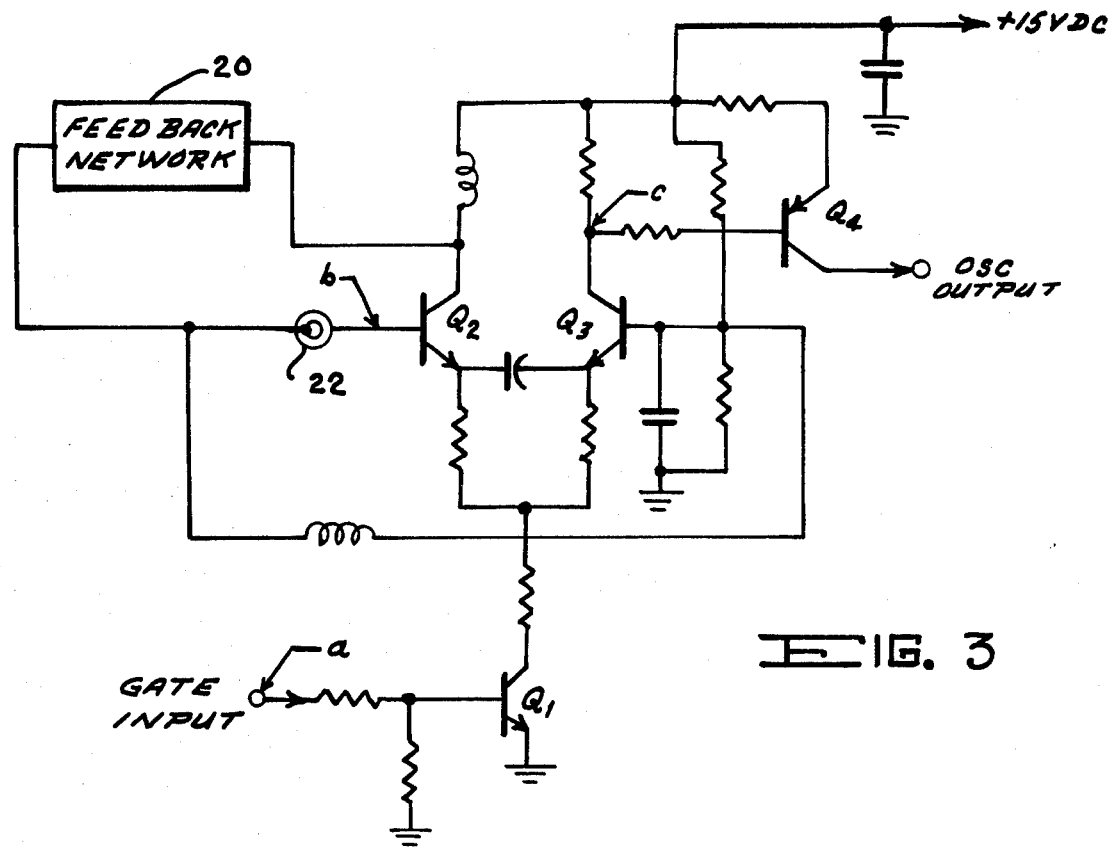
FIG. 3 is a schematic diagram of the fast settling time oscillator that is utilized in the present apparatus.
Figure 4:
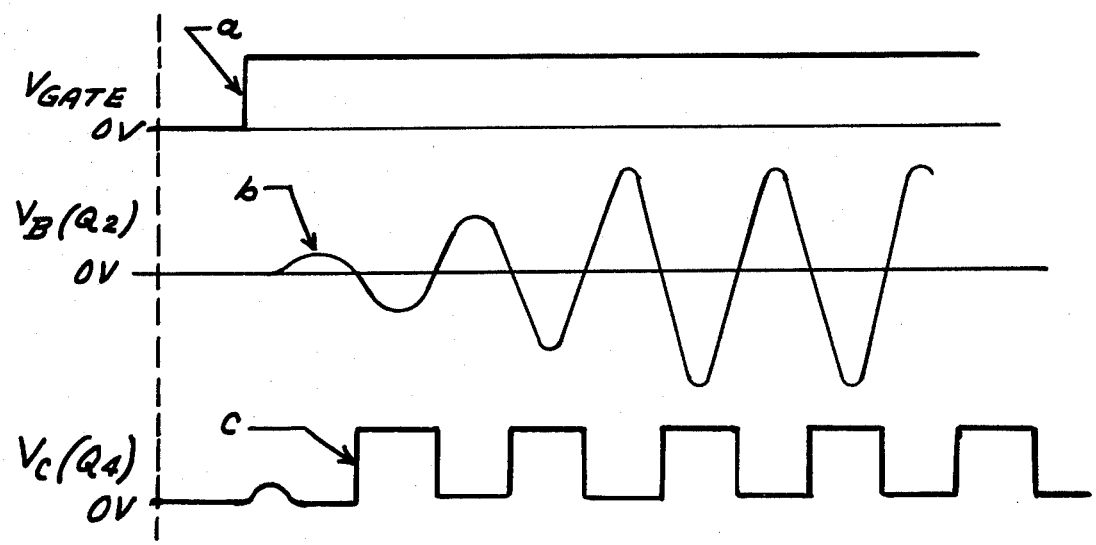
FIG. 4 is graphical representation of the waveforms which occur as indicated in FIG. 3.

Turning now to FIG. 3, there is shown a schematic diagram of a fast settling time oscillator comprising an emitter coupled transistor pair, Q2, Q3 with a positive feedback network 20 connected from the collector of transistor, Q2 to the base of transistor, Q2. The positive feedback network 20 may be a 180° phase shift at the oscillator frequency $f_o$. In the present circuit, all transistors Q1–Q4 are in the off state when the gate input is a TTL low or zero. Upon the receipt of a gate input (a TTL high), transistor Q1 is driven into saturation and both transistors Q2, Q3 are turned on. The current flowing through transistors Q2, Q3 is substantially equal. The gate input waveform is shown in FIG. 4 by waveform A. The very rapid turn on of transistor Q1 as a result of the gate input signal, causes a current step transient in the transistor pair, Q2, Q3. The sharp current step in combination with the extremely large oscillator excess loop gain, initiates an extremely rapid exponentially increasing sinusiodal oscillating waveform to occur at the base of transistor Q2. In FIG. 4, waveform B represents the signal at the base of transistor Q2. A ferrite bead 22 is included in the base of transistor Q2 to suppress UHF parasitic oscillations. If the delay in the oscillator feedback filter 20 is small, transistor, Q3 will begin to toggle almost immediately, before the sinusoidal oscillation waveform has reached full amplitude and stabilized. Thus, the number of cycles counted by the digital circuitry, or in the position in time of the impulse output with respect to the gate input leading edge, is accurately and precisely established. The collector of transistor Q3 is connected to the base of transistor Q4. The oscillator output signal appears at the collector of transistor Q4 and is shown in FIG. 4 as waveform C. In the present oscillator, transistors Q1–Q3 are transistor type 2N2369 and transistor Q4 is transistor type 2N3546.

Figure 5A:
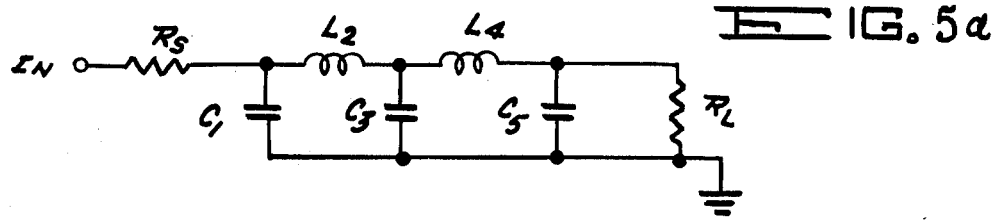
FIGS. 5a, b, c are schematic diagrams of feedback circuit that may be used in the oscillator circuit of FIG. 3.
Figures 5B, 5C:
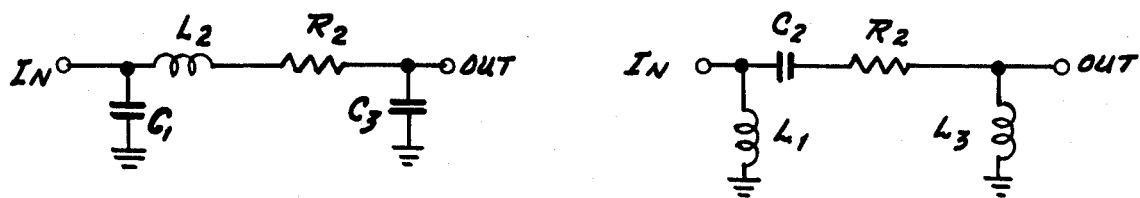

There is shown in FIGS. 5 a–c three types of filter circuits which may be utilized as the 180° feedback filter unit. In FIG. 5a there is shown a five pole singly-loaded Bessel filter which has a phase shift, $\phi = 180°$ when the oscillator frequency, fo equals the filter center frequency, fc and a delay approximately equal to one half the oscillator frequency, fo. In FIGS. 5b, c, there is shown two type of bandpass filters wherein the phase shift, $\phi$ is approximately 180° at the oscillator frequency, fo and the delay is approximately equal to $Q_L/\pi fo$. In FIG. 5b, fo and $Q_L$ are defined as follows:

$$fo \approx \frac{1}{2\pi L_2 \sqrt{\left(\frac{C_1 C_3}{C_1 + C_3}\right)}}$$

$$Q_L \approx 2\pi fo\, L_2/R_2$$

In FIG. 5c, fo and $Q_L$ are defined as follows:

$$fo \approx \frac{1}{2\pi \sqrt{C_2(L1 + L3)}}$$

$$Q_L \approx \tfrac{1}{2}\pi fo R2 C2$$

Figure 6:
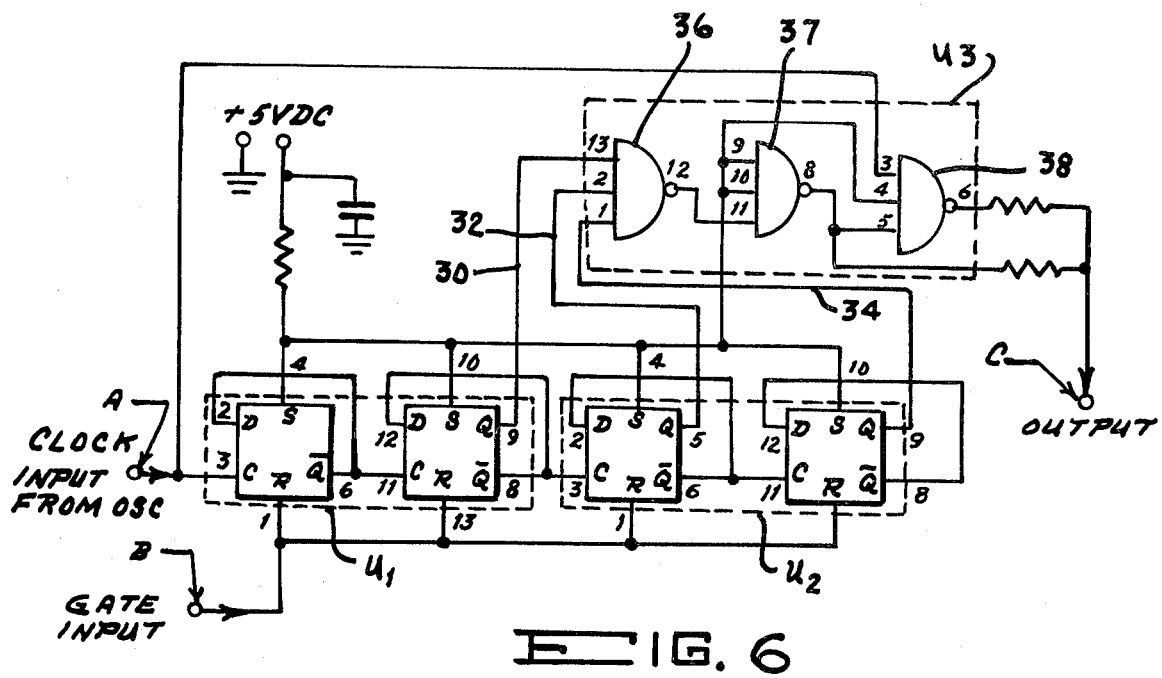
FIG. 6 is a block diagram of the digital impulse generator.
Figure 7:
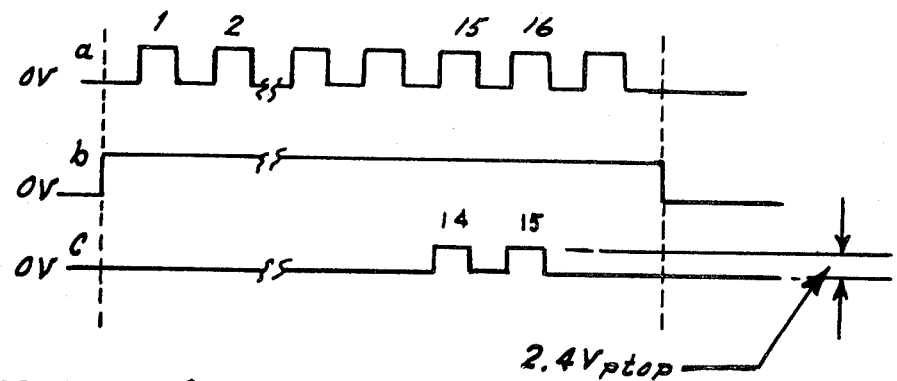
FIG. 7 is a graphical representation of the waveforms which occur as indicated in FIG. 6, and FIGS. 8a, b are schematic diagrams of low phase distortion output filters that may be utilized in the present apparatus.

There is shown in FIG. 6, the digital counting circuit which is the actual impulse producing circuitry. The clock input signal from the oscillator is applied to the input of the counters which is comprised integrated circuits U1, U2. The division by four ($\div 4$), division by eight ($\div 8$) and the division by 16 ($\div 16$) outputs from the counter are respectively applied through lines 30, 32 and 34 to the input of a series of triple input nand gates 36, 37, 38 for generation of the desired output waveform. The output waveform which appears at the output of the counting circut is shown in FIG. 7 as waveform c. FIG. 7 also provides a graphical representation of the clock input signal (waveform a) and the gate input signal (waveform b). In the present circuit integrated circuits U1, U2 are 54S74 devices and integrated circuit U3 which comprises a series of triple input nand gates is a 54S10 device. In the present circuit it may be noted that in the present example the counting circuit produced the impulse at the 14th and 15th clock pulses; however, in applications which may require a longer or shorter oscillator stabilization time, or a larger or smaller number of clock pulses in the impulse, it may be noted that this situation may be achieved through the use of addition counting circuits.

Figure 8A:
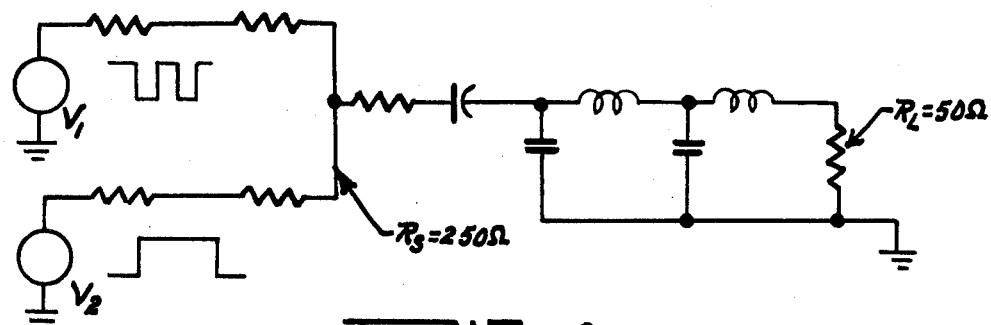
Figure 8B:
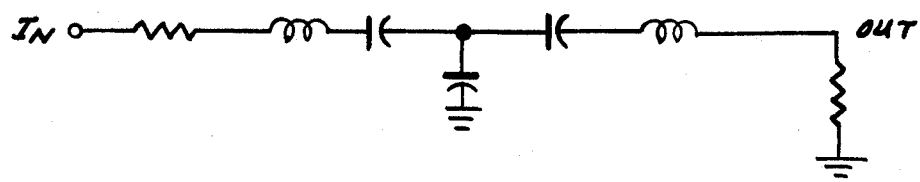

There is shown in FIGS. 8a, b two different types of wideband low phase distortion filter units that may be utilized in the present apparatus. The first filter is a four pole impedance matching low pass filter with a bandwidth of 60% and impedance matching of a source impedance of 250 ohms to a load of 50 ohms. The source impedance $R_s$ looking into the generators V1, V2 is 250 ohms. The load resistance, R2 is 50 ohms. The present filter is the same type described by G. L. Matthaei, in "Tables of Impedance Transforming Networks of Low Pass Filter Form," pages 939–963, published in the "Proceedings of IEEE," August, 1964. The filter shown in FIG. 8b is a flat symmetrical delay bandpass filter that has a bandwidth of 70% of the type that is shown and described by H. J. Blinchikoff, in "Filter in The Time and Frequency Domains," published by John Wiley & Sons, New York, 1976.

Although the invention has been described with reference to a particular embodiment, it will be understood to those skilled in the art that the invention is capable of a variety of alternative embodiments within the spirit and scope of the appended claims.

What is claimed is:

1. An impulse generator apparatus comprising in combination:
    an oscillator means, said oscillator means receiving a gate input signal, said oscillator means providing a clock frequency signal, said oscillator means having a fast settling time,
    a digital counting means receiving said clock frequency signal from said oscillator means, said digital counting means receiving said gate input signal, said gate input signal enabling said digital counting means, said digital counting means counting the cycles in said clock frequency signal and after a predetermined length of time, generating a first and second signal, means combining said first and second signal to provide a digital waveform, and
    an output filter to receive said digital waveform, said output filter having low phase distortion, said output filter removing impulse harmonics and high frequency components from said digital waveform, said output filter removing low frequency components due to non-exact DC offset cancellation, said output filter providing a pulsed sinusoidal output signal.

2. An impulse generator as described in claim 1 wherein said predetermined length of time equals N cycles, wherein N is an integer greater than zero.

3. An impulse generator as described in claim 1 wherein said digital waveform comprises two cycles of said clock frequency signal.

4. An impulse generator as described in claim 1 wherein said digital waveform has a substantially zero DC offset.

5. An impulse generator as described in claim 1 wherein said output filter comprises a four pole impedance matching low pass filter with a bandwidth of 60%.

6. An impulse generator as described in claim 1 wherein said output filter comprises a flat symmetrical delay bandpass filter with a bandpass of 70%.

7. An impulse generator as described in claim 1 wherein said digital counting means is operating as a non-synchronous counter.

* * * * *